(12) United States Patent
Orimoto et al.

(10) Patent No.: US 7,294,547 B1
(45) Date of Patent: Nov. 13, 2007

(54) SONOS MEMORY CELL HAVING A GRADED HIGH-K DIELECTRIC

(75) Inventors: Takashi Whitney Orimoto, Mountain View, CA (US); Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 13 days.

(21) Appl. No.: 11/128,392

(22) Filed: May 13, 2005

(51) Int. Cl.
*H01L 21/336* (2006.01)
(52) U.S. Cl. .............................. 438/257; 257/E21.584; 257/E29.165
(58) Field of Classification Search ................. 438/257
See application file for complete search history.

(56) References Cited

U.S. PATENT DOCUMENTS

| | | | | |
|---|---|---|---|---|
| 5,688,724 A * | 11/1997 | Yoon et al. | .................. | 438/778 |
| 5,914,895 A | 6/1999 | Jenne | ..................... | 365/185.08 |
| 6,090,659 A * | 7/2000 | Laibowitz et al. | .......... | 438/240 |
| 6,163,049 A | 12/2000 | Bui | ........................... | 257/321 |
| 6,215,702 B1 | 4/2001 | Derhacobian et al. | | |
| 6,407,435 B1 * | 6/2002 | Ma et al. | ..................... | 257/411 |
| 6,445,030 B1 | 9/2002 | Wu et al. | ..................... | 257/315 |
| 6,559,014 B1 * | 5/2003 | Jeon | ............................ | 438/287 |
| 6,562,491 B1 | 5/2003 | Jeon | | |
| 6,617,639 B1 * | 9/2003 | Wang et al. | ................. | 257/324 |
| 6,642,573 B1 | 11/2003 | Halliyal et al. | | |
| 6,744,675 B1 | 6/2004 | Zheng et al. | | |
| 6,750,066 B1 | 6/2004 | Cheung et al. | | |
| 6,753,570 B1 | 6/2004 | Tripsas et al. | | |
| 6,760,270 B2 | 7/2004 | Chindalore et al. | | |
| 6,768,160 B1 | 7/2004 | Li et al. | | |
| 6,797,599 B2 | 9/2004 | Visokay et al. | | |
| 6,894,932 B1 | 5/2005 | Melik-Martirosian et al. | ..................... | 365/185.28 |
| 7,005,695 B1 * | 2/2006 | Agarwal | ...................... | 257/310 |
| 7,034,356 B2 * | 4/2006 | Nomoto et al. | ............. | 257/324 |
| 7,038,284 B2 * | 5/2006 | Haukka et al. | ............. | 257/411 |
| 7,091,548 B2 * | 8/2006 | Jeong et al. | ................. | 257/310 |
| 7,138,680 B2 * | 11/2006 | Li et al. | ...................... | 257/315 |
| 2002/0024092 A1 * | 2/2002 | Palm et al. | .................. | 257/330 |
| 2002/0090808 A1 * | 7/2002 | Jeon et al. | .................... | 438/622 |
| 2003/0062567 A1 | 4/2003 | Zheng et al. | ................ | 257/316 |
| 2003/0122204 A1 | 7/2003 | Nomoto et al. | ............. | 257/406 |
| 2004/0028952 A1 | 2/2004 | Cartier et al. | | |
| 2005/0006696 A1 | 1/2005 | Noguchi et al. | ............. | 257/316 |
| 2005/0036391 A1 | 2/2005 | Tomile et al. | .............. | 365/232 |

(Continued)

FOREIGN PATENT DOCUMENTS

DE 29 46 864 A1 6/1980

OTHER PUBLICATIONS

Co-pending U.S. Appl. No. 11/008,233, filed Dec. 10, 2004; entitled: "Memory Cell Having Enhanced High-K Dielectric", by Joong Jeon et al., 30 pages.

(Continued)

*Primary Examiner*—Michael Lebentritt
*Assistant Examiner*—Thu-Huong Dinh
(74) *Attorney, Agent, or Firm*—Harrity Snyder, LLP (57) ABSTRACT

A semiconductor memory device may include an intergate dielectric layer of high-K dielectric materials interposed between a charge storing layer and a control gate. The high-K materials may be deposited in such a manner that the materials are gradually graded with respect to one another.

17 Claims, 12 Drawing Sheets

U.S. PATENT DOCUMENTS

2006/0003529 A1* 1/2006 Baker .................... 438/258
2006/0160303 A1* 7/2006 Ang et al. ................ 438/257

OTHER PUBLICATIONS

Co-pending U.S. Appl. No. 11/049,855, filed Feb. 4, 2005; entitled: "Non-Volatile Memory Device With Improved Erase Speed", by Joong Jeon et al., 22 pages.

Co-pending U.S. Appl. No. 11/086,310, filed Mar. 23, 2005; entitled: "High K Stack For Non-Volatile Memory", by Wei Zheng et al., 21 pages.

Co-pending U.S. Appl. No. 11/196,434, filed Aug. 4, 2005; entitled: "SONOS Memory Cell Having High-K Dielectric", by Takashi Whitney Orimoto et al., 27 pages.

* cited by examiner

SONOS MEMORY CELL HAVING A GRADED HIGH-K DIELECTRIC

TECHNICAL FIELD

Devices and methods described herein relate generally to non-volatile memory (NVM), and more specifically, to non-volatile memory devices having a silicon-oxide-nitride-oxide-silicon (SONOS) structure.

BACKGROUND ART

Conventional semiconductor memory devices may use a memory structure characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and a source and drain on opposing sides of the channel region.

Another particular type of memory cell structure is characterized by a vertical stack that includes an insulating tunnel oxide layer, a charge trapping nitride dielectric layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

The SONOS memory cell may be programmed by a hot electron injection process that injects electrons from the channel region to the nitride layer to create a non-volatile negative charge within the nitride layer. The electron injection may be performed by applying a drain-to-source bias along with a positive voltage on the control gate. The voltage on the control gate inverts the channel region while the drain-to-source bias accelerates electrons towards the drain region. The electrons are generally accelerated towards the drain region, with some of the electrons being re-directed towards the bottom oxide layer. The accelerated electrons gain enough kinetic energy to cross the bottom oxide layer and enter the nitride layer. The nitride layer traps the injected electrons and thus acts as a charge storing layer.

Once programmed, the charged nitride layer becomes a floating gate for the memory cell. The negatively charged floating gate causes the threshold voltage of the memory cell to increase, which changes the magnitude of the current flowing between the source and the drain at various control gate voltages. Reading the programmed, or non-programmed, state of the memory cell is based on the magnitude of the current flowing between the source and drain at a predetermined control gate voltage.

The programmed SONOS memory cell may eventually need to be erased. A typical erase mechanism is hot hole injection (HHI). In HHI, a negative voltage may be placed on the control gate and the source-to-well and drain-to-well interfaces may be reverse biased. The reverse bias generates hot holes that are attracted to the floating gate by the negative voltage applied to the control gate. This causes a net positive charge in the floating gate and reduces the threshold voltage of the device.

One potential problem associated with erasing the memory cell using HHI is that this process tends to damage the bottom oxide layer.

SUMMARY OF THE INVENTION

One aspect is directed to a memory device including a gate dielectric formed on a substrate, a charge storing element formed on the gate dielectric, and an intergate dielectric formed on the charge storing element. The intergate dielectric includes at least two high-K materials deposited in a graded manner with respect to each other. A control gate is formed above the intergate dielectric.

Another aspect is directed to a method of manufacturing a semiconductor device. The method includes forming a first dielectric over a substrate, forming a charge storage element over the first dielectric, forming a second dielectric over the charge storage element, and forming a third dielectric over the second dielectric. The third dielectric includes at least two high-K materials deposited in a graded manner with respect to each other. Further, the method includes forming a control gate over the third dielectric.

Yet another aspect is directed to a memory device including a gate dielectric formed on a substrate and a charge storing element formed on the gate dielectric. The charge storing element includes at least two high-K materials. The memory device further includes an intergate dielectric formed on the charge storing element and a control gate formed above the intergate dielectric.

BRIEF DESCRIPTION OF THE DRAWINGS

Reference is made to the attached drawings, wherein elements having the same reference number designation may represent like elements throughout. In the drawings.

DETAILED DESCRIPTION

The following detailed description of the invention refers to the accompanying drawings. Also, the following detailed description does not limit the invention. Instead, the scope of the invention is defined by the appended claims and equivalents.

Techniques described below relate to a semiconductor memory device, a method of using the semiconductor memory device, and a method of making the semiconductor memory device. The semiconductor memory device may include an intergate dielectric layer having a high-dielectric constant (K) interposed between a charge storing layer and a control gate. The high-K intergate dielectric layer may be graded with respect to the high-K material(s) used. By grading the high-K material, interfaces that may otherwise occur can be reduced or eliminated.

Figure 1:
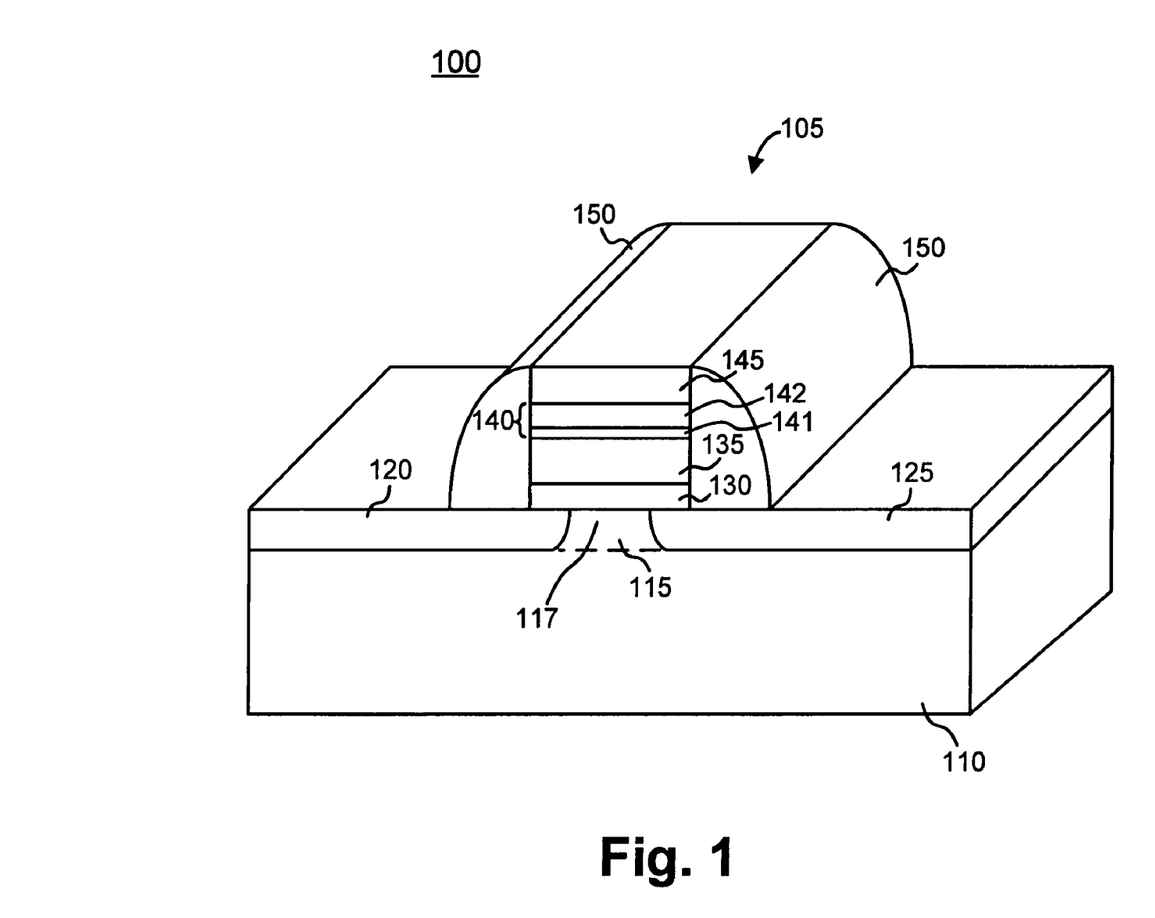
FIG. 1 is a perspective view of a semiconductor device consistent with aspects of the invention.

FIG. 1 is a perspective view of a semiconductor device 100 consistent with aspects of the invention. Device 100 may be a SONOS type memory cell having a vertical stack structure 105. Device 100 is illustrated as a single memory cell. In practice, device 100 will typically include an array of a large number of memory cells formed on a single integrated circuit.

Device 100 may include a semiconductor substrate 110 having an active region 115. A source 120 and a drain 125 are formed in the active region 115. A gate dielectric 130 is formed on the semiconductor substrate 110. A charge storing layer 135 is formed on the gate dielectric 130. The charge storing layer 135 may be electrically isolated from other components in device 100. An intergate dielectric 140 is formed on the charge storing layer 135. Intergate dielectric 140 may include high-K dielectric materials. In one implementation, intergate dielectric 140 may include an oxide (e.g., $SiO_2$) layer 141 and a high-K dielectric layer 142 formed over layer 141. High-K layer 142 may include multiple materials deposited in different proportions within layer 142. In one implementation, for instance, layer 142 may begin as pure aluminum oxide ($Al_2O_3$) at the interface of layers 141 and 142, progress to a graded composition of $Al_2O_3$ and hafnium oxide ($HfO_2$), and end as pure $HfO_2$.

A control gate 145 is formed on intergate dielectric 140. Gate dielectric 130, charge storing layer 135, intergate dielectric 140, and control gate 145 form vertical stack 105 of the memory cell. Spacers 150 may be formed on the sidewalls of the vertical stack 105. Isolation techniques that are known in the art may be used to electrically isolate memory cells in the semiconductor device 100 from other memory cells or from other semiconductor devices.

Semiconductor substrate 110 may include any conventional substrate. For example, semiconductor substrate 110 may include a bulk silicon semiconductor substrate, a silicon-on-insulator (SOI) semiconductor substrate, a silicon-on-sapphire (SOS) semiconductor substrate, or a semiconductor substrate formed of other materials known in the art. The techniques described herein are not limited to any particular type of semiconductor substrate.

Active region 115 may be a p-type region or an n-type region formed in semiconductor substrate 110. Active region 115 may be pre-doped prior to forming stack 105 or doped after formation of all or part of stack 105. Active region 115 may be doped with p-type impurities for n-type devices and/or n-type impurities for p-type devices.

Source 120 and drain 125 may be two N+ regions formed in the active region 115 of the semiconductor substrate 110. Alternatively, source 120 and the drain 125 may be two P+ regions. Source 120 and drain 125 may be deep or shallow implant regions based on the particular circuit requirements.

Gate dielectric 130 is shown as a single layer dielectric. Gate dielectric 130 may be made of suitable gate oxide dielectric materials, such as $SiO_2$. Gate dielectric 130 may have a thickness of, for example, between 30 and 80 Å.

It should be understood by those skilled in the art that the gate dielectric 130 could be a multi-layer dielectric. For example, a layer of $SiO_2$ may be deposited on the semiconductor substrate 110 followed by another dielectric.

Charge storing layer 135 may be made of typical, well-known dielectric materials. For example, for SONOS-type memory cells, charge storing layer 135 may include a nitride material. In an exemplary embodiment, charge storing layer 135 may have a thickness of between about 30 and 150 Å. In some implementations, charge storing layer 135 may be formed in a graded manner, as described in detail below.

Channel 117, formed in active region 115, may be a p-region interposed between source 120 and drain 125. Alternatively, an n-type channel could be interposed between two P+ regions.

Intergate dielectric 140 is disposed on charge storing layer 135. As previously mentioned, intergate dielectric 140 may include a layer 142 that includes graded high-K materials. In an exemplary embodiment, layer 142 may have a thickness of between about 70 and 250 Å. Layer 141 may comprise an oxide, such as $SiO_2$, and may have a thickness of between about 30 and 150 Å. In some embodiments, layer 141 may not be included and intergate dielectric 140 will include only high-K dielectric layer 142.

Control gate 145 may be positioned on top of intergate dielectric layer 140. Control gate 145 may be made of typical, well-known gate electrode materials, such as, example, polysilicon. Exemplary control gate 145 may have a thickness of between about 500 and 3000 Å.

Spacers 150 may be made of a dielectric material. The dielectric material may be $Si_xN_y$, $SiO_xN_y$, $Al_2O_3$, or another dielectric material. Exemplary spacers 150 may have total heights between 700 and 3500 Å, based on the height of stack 105. The width of spacers 150 may range from about 100 to 1000 Å. Further, spacers 150 are shown as single layer spacers. However, spacers 150 could be multi-layer spacers.

Not shown in FIG. 1 are additional structures of a final semiconductor device, such as various conductive layers, interlayer dielectrics, contacts, protective coatings and other parts of the structure which would be included in a complete, working semiconductor device. These additional structures are not shown or described for simplicity and brevity. Nevertheless, how such structures could be formed will be easily understood by those of skill in the art.

As used herein, the term "high-K dielectric" refers to a dielectric material having a dielectric constant (K) greater than $SiO_2$ (K=3.9). Such high-K dielectric materials include, for example, silicon oxynitride, which has a K of about 4 to about 8 depending on the relative content of oxygen and nitrogen; silicon nitride, which has a K of about 6 to about 9; $Al_2O_3$, which has a K of about 10; composite materials such as hafnium silicate, which has a K of about 14; hafnium silicon oxynitride, which has a K of about 16, depending on the relative content of oxygen and nitrogen; hafnium silicon nitride, which has a K of about 18; $HfO_2$, $ZrO_2$, $Ta_2O_5$ and others. It is understood that the present invention is not limited to the specific dielectric materials disclosed herein, but may include any appropriate high-K dielectric materials which are known and are compatible with the remaining elements of the semiconductor device with which the dielectric materials are to be used.

It is noted that the K-values, or relative permittivity, for high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material. As used herein, when a material is referred to by a specific chemical name or formula, the material may include non-stoichiometric variations of the stoichiometrically exact formula identified by the chemical name.

Figure 2:
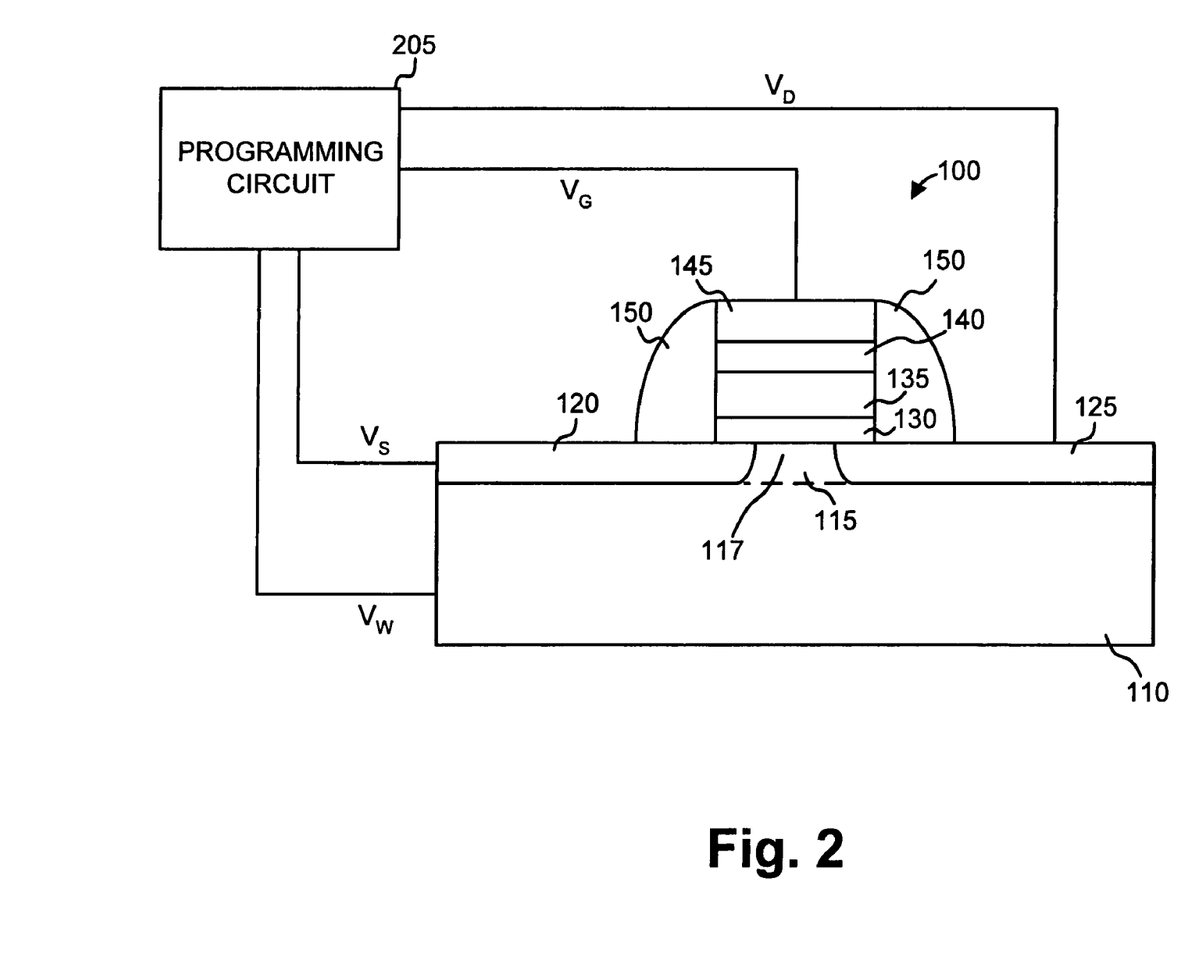
FIG. 2 is a front view of the semiconductor device shown in FIG. 1.

FIG. 2 is a front view of semiconductor device 100. A programming circuit 205 is additionally shown in FIG. 2. Programming circuit 205 may be used to program/erase semiconductor device 100. For instance, for a program operation, programming circuit 205 may apply various voltages to semiconductor device 100 to inject electrons into charge storing layer 135. The injected electrons become trapped in charge storing layer 135 and cause the threshold voltage of device 100 to increase. When in this state, device 100 can be interpreted to be at a first logical state (e.g., logic 1 or high). To erase the state of device 100, programming circuit 205 may perform, for example, Fowler-Nordheim (FN) tunneling to cause electrons to tunnel out of charge storing layer 135. The threshold voltage of device 100 will then decrease. When in this state, device 100 can be interpreted to be at a second logical state (e.g., logic 0 or low).

As shown in FIG. 2, programming circuit 205 may be electrically connected to memory device 100 via four control lines: drain line $V_D$, gate line $V_G$, source line $V_S$, and well line $V_W$. Well line $V_W$ may connect to the well or body of the semiconductor substrate 110.

Method of Manufacture

Figure 3:
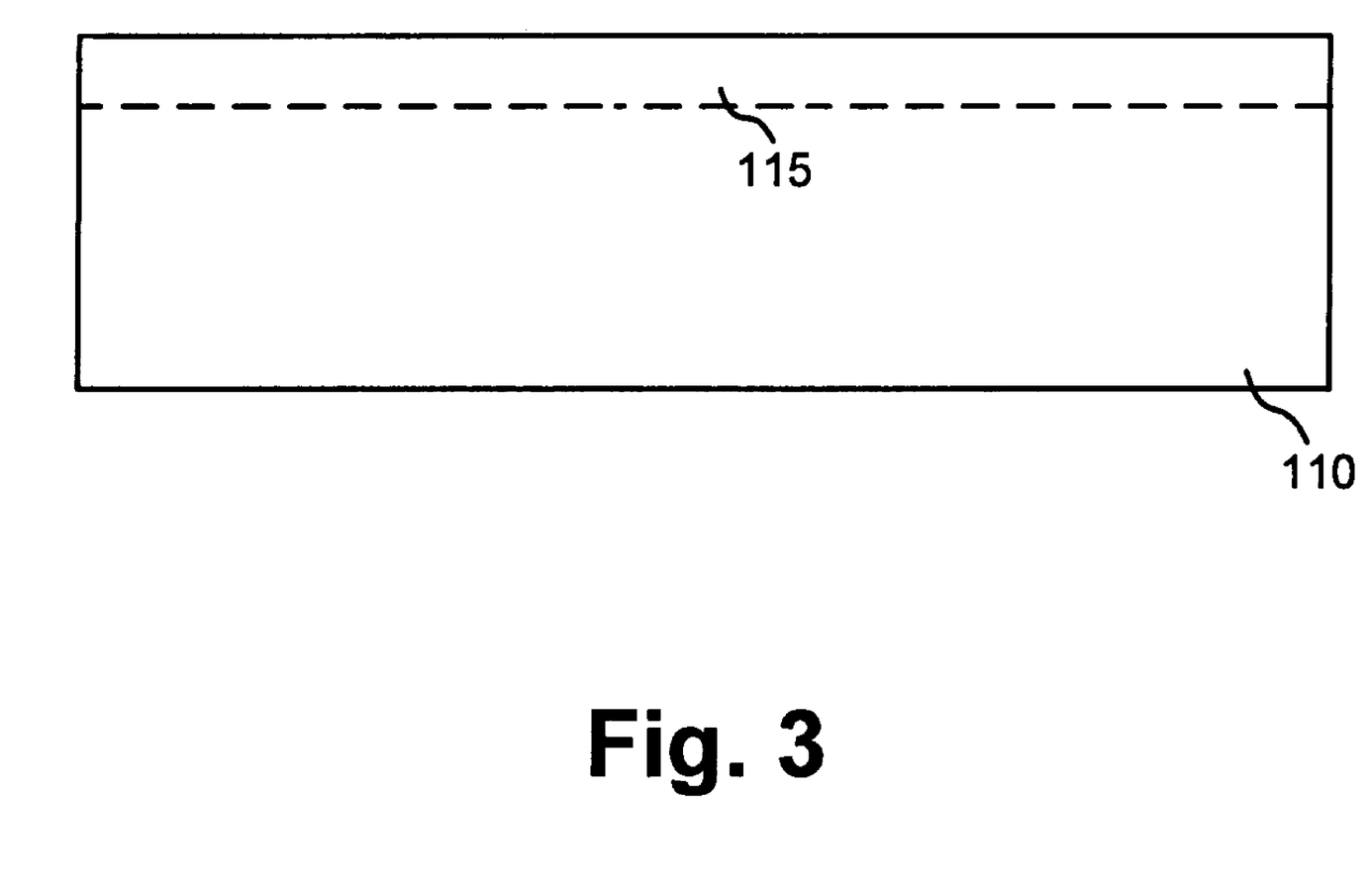
FIGS. 3-8 are diagrams illustrating an exemplary method of manufacturing the device shown in FIG. 1.

FIGS. 3-8 are diagrams illustrating an exemplary method of manufacturing device 100. To begin, as shown in FIG. 3, semiconductor substrate 110 is provided. Semiconductor substrate 110 may be any appropriately selected semiconductor substrate known in the art. Semiconductor substrate 110 may be subjected to implants to provide the active region 115 in semiconductor substrate 110 as is known in the art. For instance, boron or indium may be implanted to form a p-type region or channel for an n-type device and phosphorous or arsenic may be implanted to form an n-type region or channel for a p-type device.

Figure 4:
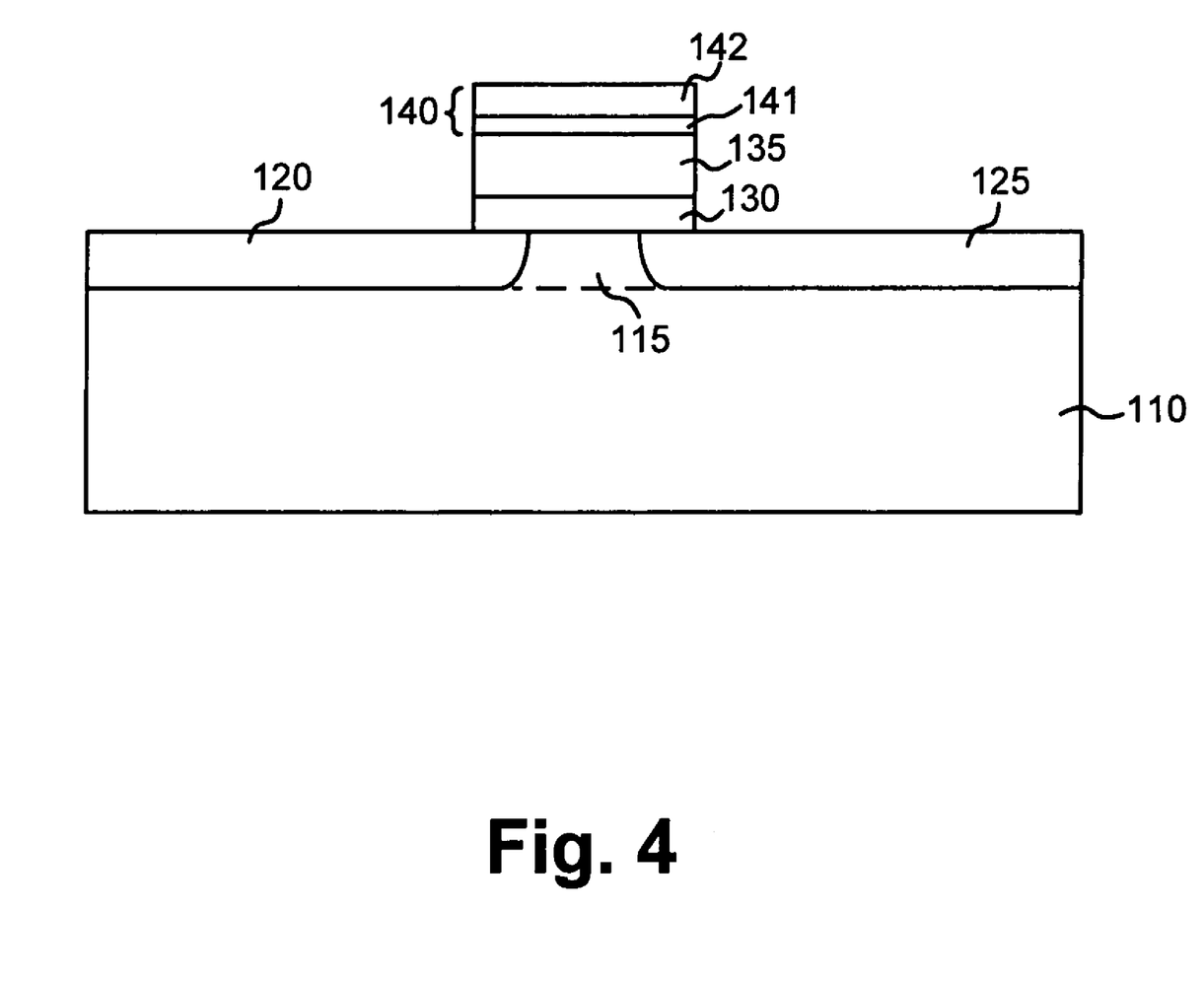

Now referring to FIG. 4, gate dielectric 130 maybe formed on the semiconductor substrate 110. Gate dielectric 130 may comprise an oxide, such as $SiO_2$, and may be thermally grown or deposited to a thickness between 30 and 80 angstroms. Charge storing layer 135 may be formed on gate dielectric 130. Charge storing layer 135 may be formed as a nitride layer and may be deposited to a thickness between about 30 and 150 Å. Alternatively, charge storing layer 135 may include a layer other than a nitride layer, other high-K materials, or another material capable of holding charge. In one embodiment, charge storing layer 135 may be implemented as a layer including a number of high-K materials, as described in more detail below with reference to FIGS. 9a and 10. An intergate dielectric 140 may next be formed on top of charge storing layer 135. Intergate dielectric 140 may include a $SiO_2$ layer 141 grown to a thickness between about 30 and 150 Å and a high-K layer 142 deposited on top of layer 141 to a thickness of about 70 to 250 Å.

Figure 5:
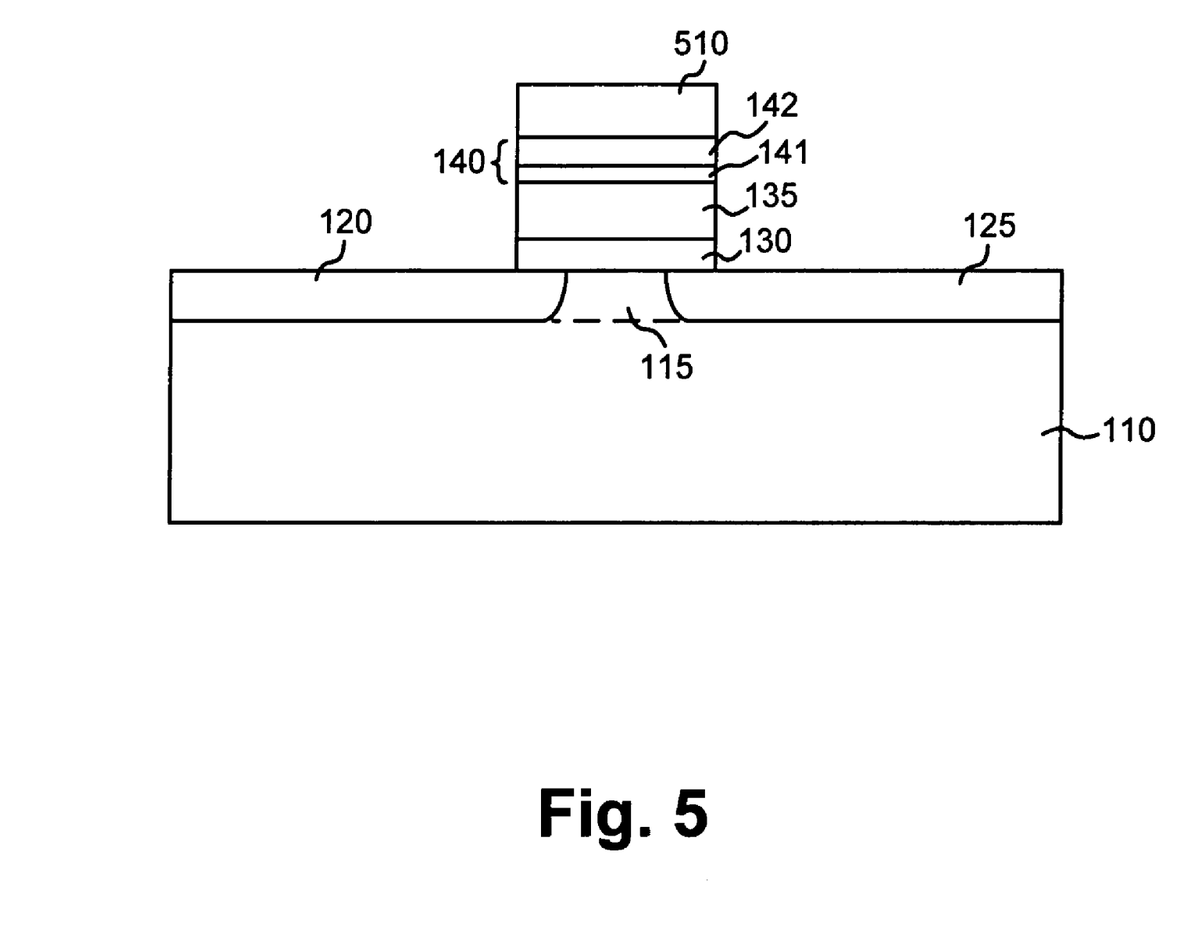

Referring to FIG. 5, a protective layer 510 may be formed on intergate dielectric layer 140. Protective layer 510 may be formed in order to protect intergate dielectric 140 from, for example, impurity penetration during an implantation process to form source region 120 and drain region 125.

The semiconductor substrate 110 may next be subjected to implants to produce source region 120 and drain region 125. Source region 120 and drain region 125 may be formed by a main perpendicular implant. The main perpendicular implant is a relatively high energy, high concentration implant which is capable of producing source 120 and the drain 125. Boron, arsenic, or phosphorous may be used alone or in any combination as the dopant. Other p-type or n-type impurities may alternatively be used.

Although source region 120 and drain region 125 are shown as single implantation regions, it should be understood that another implantation process may be performed to form extension regions as is known in the art. It should also be understood that the formation of source region 120 and drain region 125 may take place before the formation of the charge storing layer 135 or after the formation of vertical stack 105.

Protective layer 510 may next be etched down to intergate dielectric 140. Thus, protective layer 510 may be removed to leave an upper surface of intergate dielectric layer 140 exposed. It should be appreciated that any suitable selective etching methods well-known in the art may be used.

Figure 6:
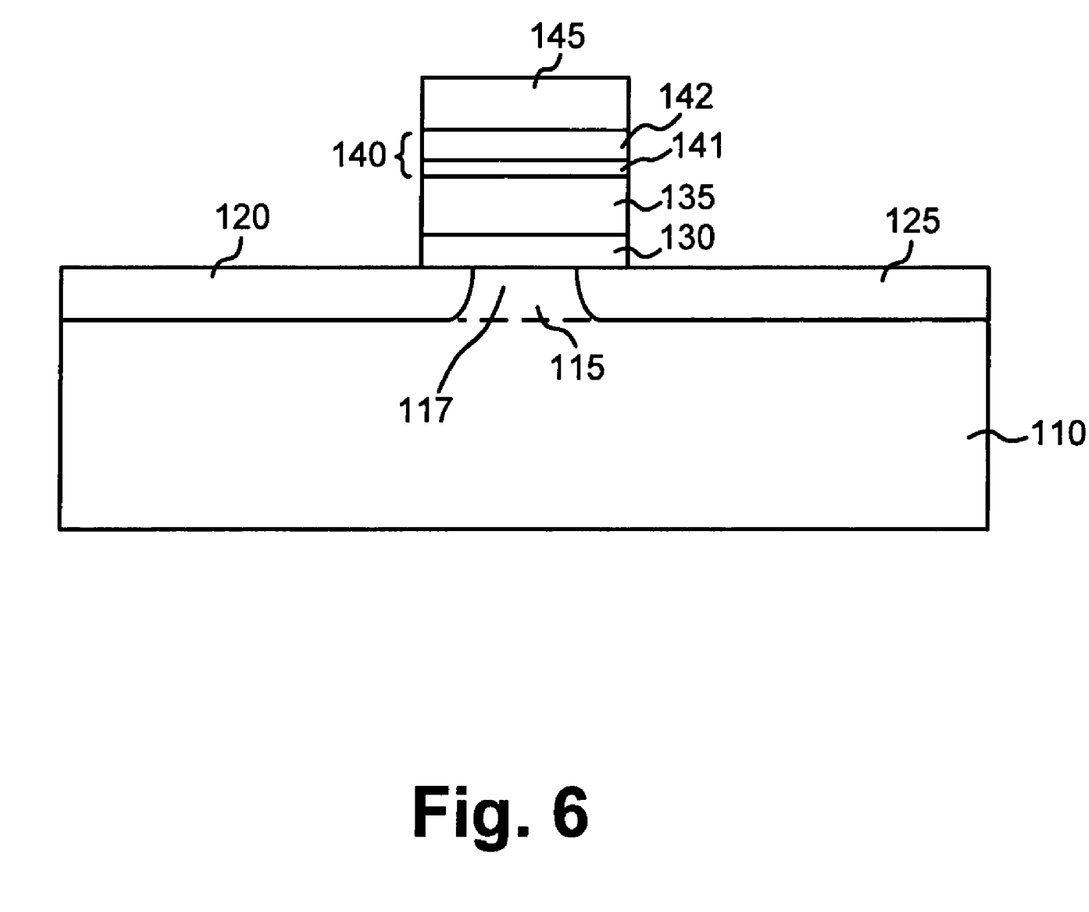

Referring to FIG. 6, an undoped polysilicon layer 145 may be deposited and patterned on the intergate dielectric layer 140. The polysilicon may then be doped using an implantation process to implant the polysilicon. Alternatively, layer 145 may be pre-doped.

Figure 7:
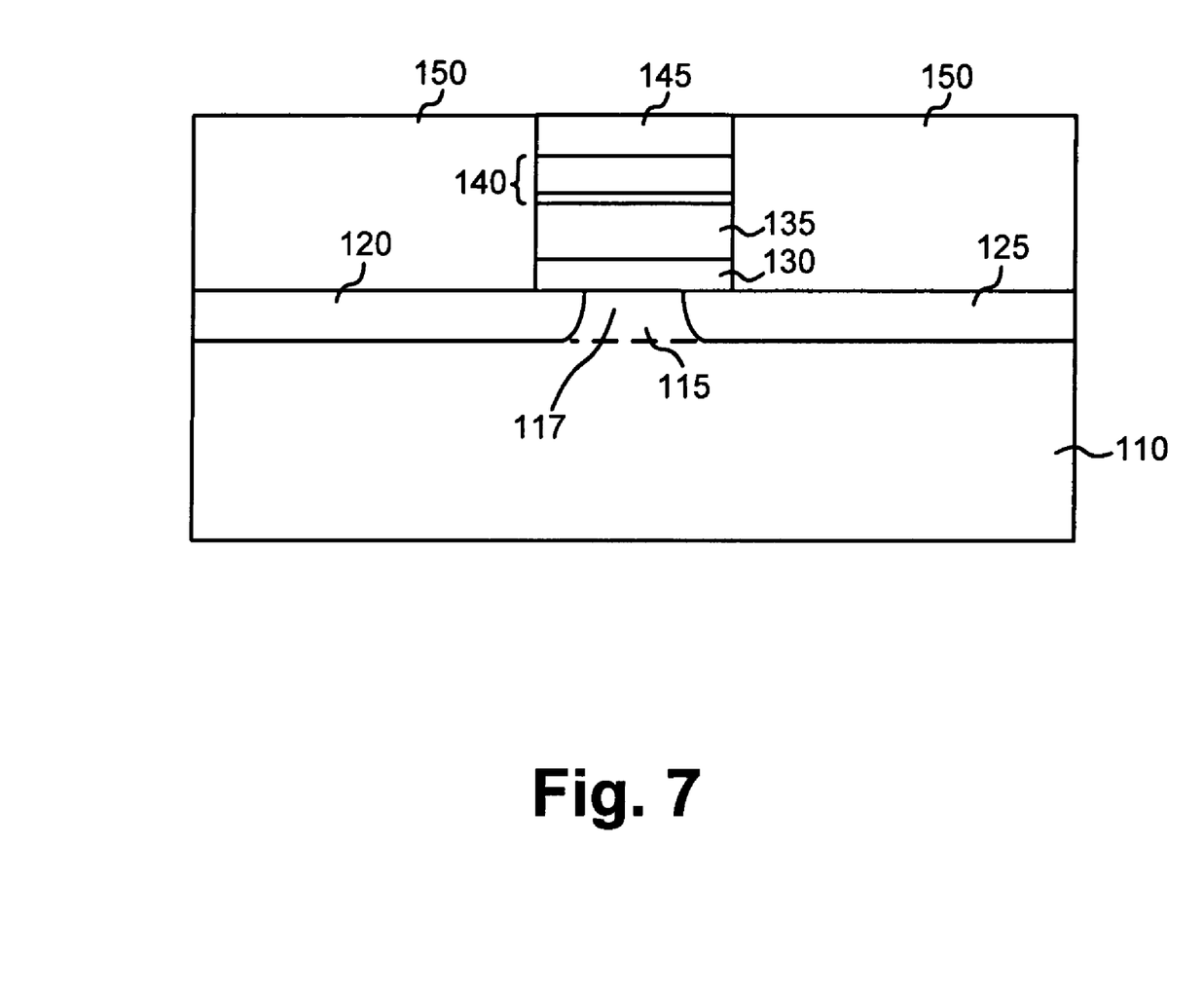
Figure 8:
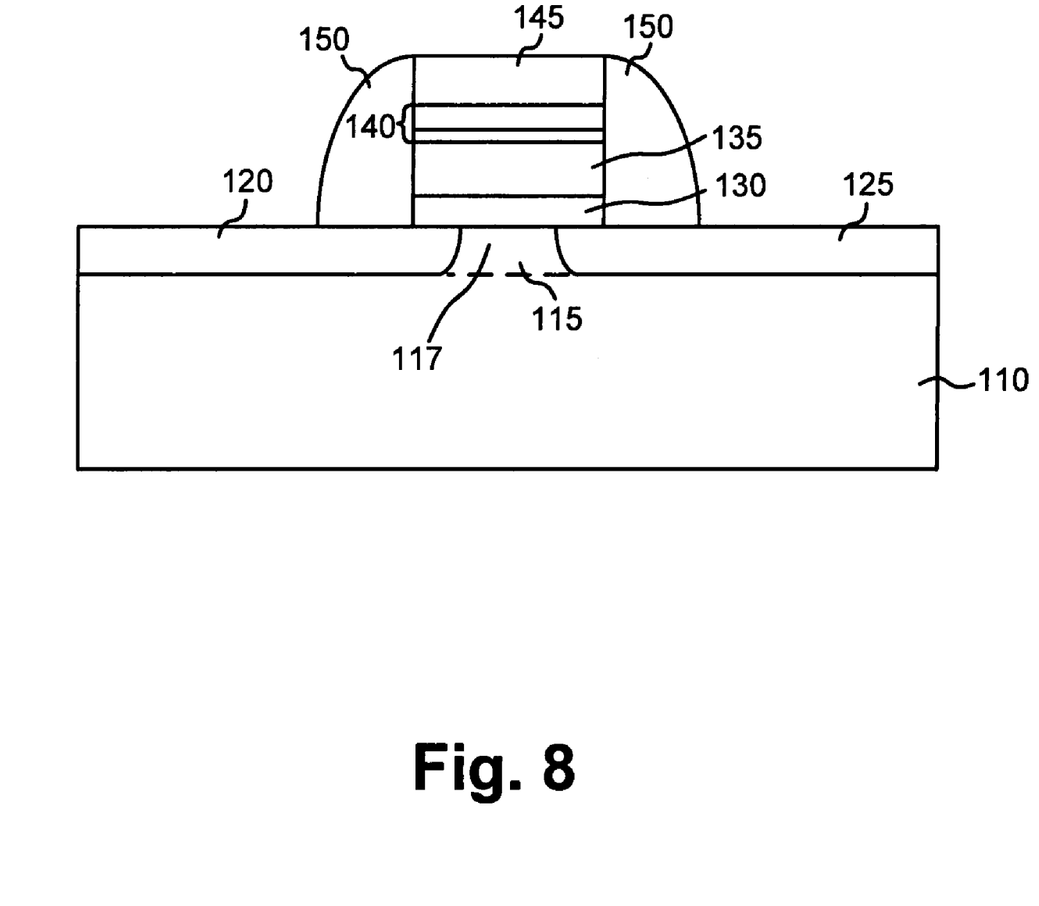

Next, referring to FIG. 7, a spacer layer 150 may be deposited on the semiconductor substrate 110. Spacer layer 150 may be polished back to the top surface of polysilicon layer 145. The polishing may be done using conventional techniques, which are well-known in the art. The spacer layer 150 may be a tetraethylorthosilicate (TEOS) layer or other spacer material known to those skilled in the art. Spacer layer 150 may be additionally anisotropically etched with a suitable etchant. The spacer layer 150 is etched to expose the top surface of a portion of semiconductor substrate 110, leaving the spacers 150 shown in FIG. 8.

Subsequently, connections such as word lines and bit lines may be formed using conventional techniques in order to establish electrical connections between the semiconductor device 100 and other nodes (such as programming circuit 205). The formation of the connections are not shown.

High-K Layer 142

As previously described, high-K layer 142 may include a mixture of various high-K materials. The mixture may be graded such that different locations within layer 142 contain more of one particular material than another particular material(s). By grading layer 142, a number of benefits may be achieved. For example, $HfO_2$ has a higher dielectric constant than $Al_2O_3$, but $HfO_2$ can chemically react if in direct contact with silicon. Thus, the $Al_2O_3$ may be used as a buffer layer and grading the interfaces between these two materials may prevent unwanted interfaces that could cause defects or charge traps. Also, in some implementations, the band gap can be tailored to improve FN erase and data retention for flash memory. For instance, the higher-K material can be placed near the control gate in order to block back-gate injection during FN erase, and the less trappy material can be placed near the charge storage layer to help prevent charge loss and data retention problems.

Figure 9:
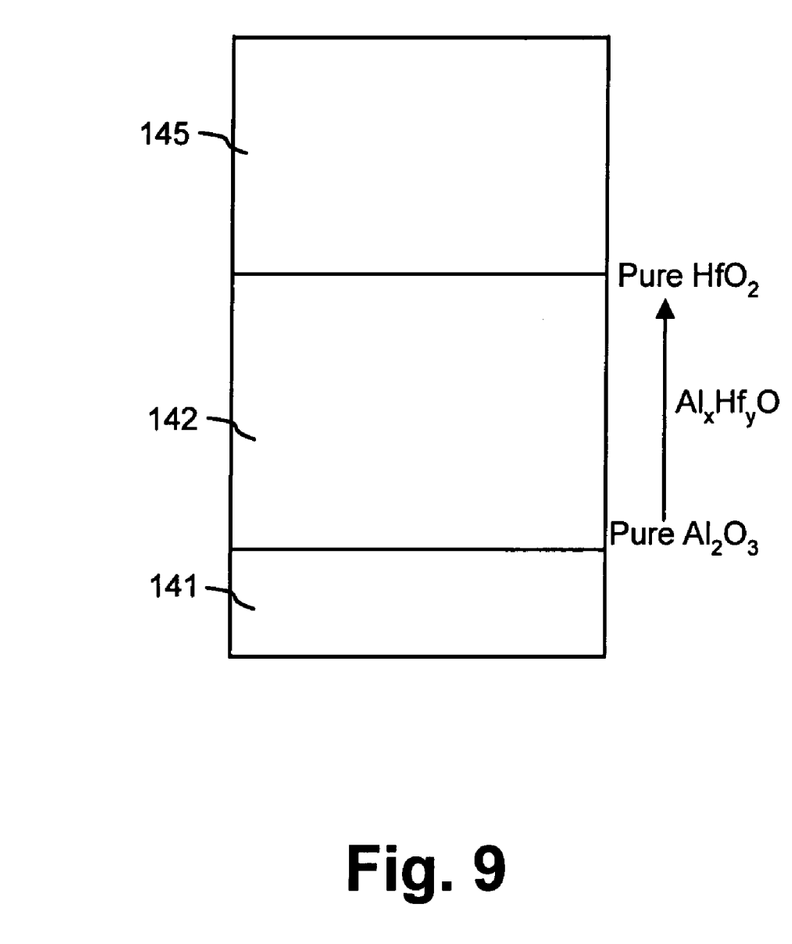
FIG. 9 is a diagram illustrating an exemplary transition between different materials in a high-K layer.

FIG. 9 is a diagram illustrating an exemplary transition between different materials in high-K layer 142. In this example, layer 142 includes two materials: $Al_2O_3$ and $HfO_2$. As shown, at the interface between layer 141 and layer 142, layer 142 may be initially formed as a relatively pure layer of $Al_2O_3$. As layer 142 is formed, $HfO_2$ may be gradually introduced to obtain $Al_2O_3$ and $HfO_2$ mixed in various ratios. The graded mixture of the materials may formed such that the ratio of $HfO_2$ to $Al_2O_3$ is gradually changed to include more $HfO_2$ and less $Al_2O_3$ until, at the interface of layers 142 and 145, layer 142 is relatively pure $HfO_2$. More specifically, layer 142 may include a mixed material $Al_xHf_yO$, where the variables x and y can vary across the entire spectrum of ratios, from x=1, y=0 (i.e., pure aluminum oxide) to x=0, y=1 (i.e., pure hafnium oxide).

High-K layer 142 may be formed via atomic layer deposition (ALD). In ALD, a material may be deposited for one or more cycles to produce thin film layers of the deposited material. The graded nature of layer 142 may be produced by gradually altering the ratio of material cycles. For example, for a two material layer (e.g., $HfO_2$ and $Al_2O_3$), the ratio, A:B, of the first material (material A) and the second material (material B), may be gradually changed from predominantly or all material A to predominately or all material B. For instance, the ALD cycle ratio may begin with the ratio 10:0, then change to 9:1, then change to 8:2, . . . , then 2:8, then 1:9, and then end at 0:10.

Figure 10A:
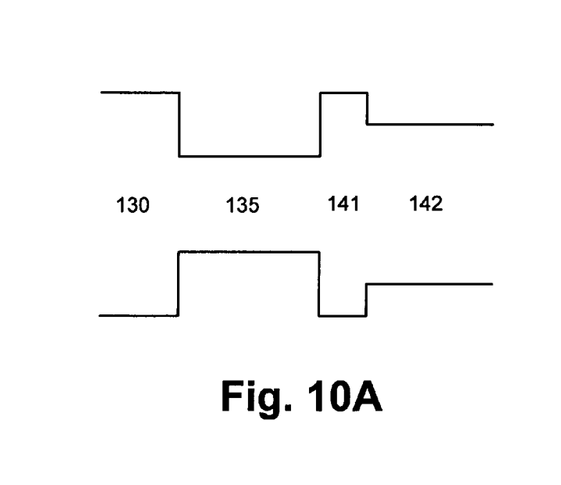
FIGS. 10A-10C are exemplary energy band diagrams for various formations for the device shown in FIG. 1.
Figure 10B:
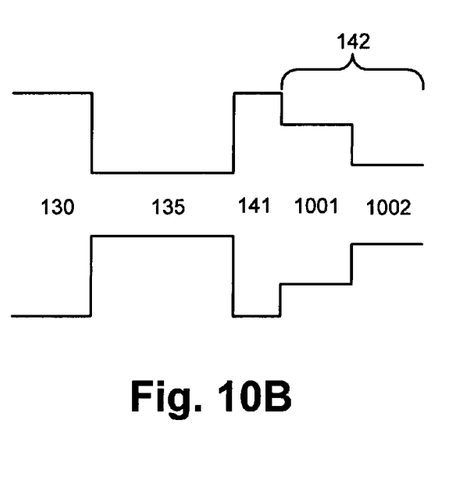
Figure 10C:
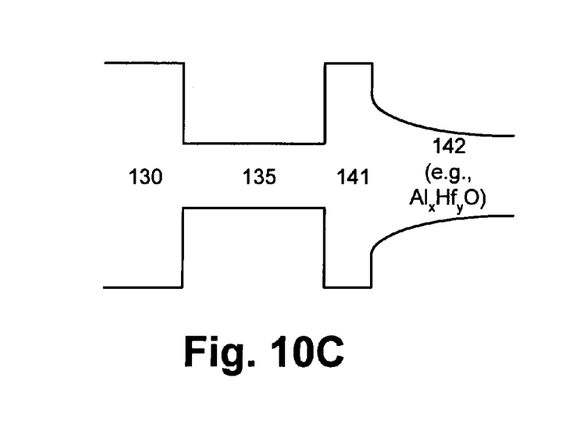

FIGS. 10A-10C are exemplary energy band diagrams for various formations of gate dielectric 130, charge storing layer 135, and layers 141 and 142. In FIG. 10A, an energy band diagram is illustrated in which layer 142 is not graded. For example, layer 142 may be relatively pure $Al_2O_3$. Accordingly, layer 142 has a constant bandgap energy. FIG. 10B illustrates an energy band diagram in which layer 142 is implemented as a laminate structure. For example, layer 142 may be formed as a first layer 1001 of relatively pure $Al_2O_3$ followed by a second layer 1002 of relatively pure $HfO_2$. The bandgap energy within layers 1001 and 1002 are constant and there is a discontinuity at the interface between layers 1001 and 1002. FIG. 10C illustrates an energy band diagram in which layer 142 is graded in a gradual manner, as described above. Advantageously, the bandgap energy gradually transitions between the bandgap energy level of pure $Al_2O_3$ and pure $HfO_2$.

Although high-K layer 142 has been primarily described as a graded mixture of two materials ($Al_2O_3$ and $HfO_2$), one of ordinary skill in the art will appreciate that more than two materials could be used in high-K layer 142. Additionally, high-K materials other than $Al_2O_3$ and $HfO_2$ could also be used to create high-K layer 142.

Charge Storing Layer 135

In some implementations, charge storing layer 135 may be formed of high-K materials, such as $Al_2O_3$ and $HfO_2$. These materials may be deposited via ALD in a graded manner similar to the graded deposition of layer 142. For example, ALD may be performed to initially deposit relatively pure $Al_2O_3$ and gradually transition to relatively pure $HfO_2$. At this point, charge storing layer 135 may continue to be formed by gradually transitioning from the relatively pure $HfO_2$ to relatively pure $Al_2O_3$. In other words, charge storing layer 135 may be formed as $Al_2O_3$ at the interfaces between layers 130 and 141, as $HfO_2$ at the center of charge storing layer 135, and otherwise as a gradual transition between the two materials.

Figure 11A:
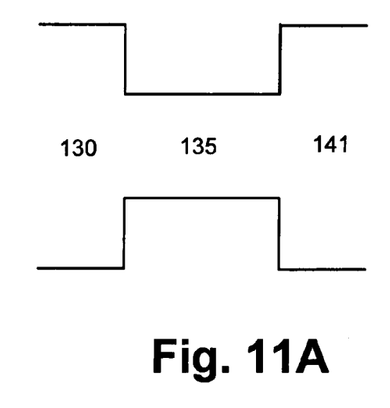
FIGS. 11A-11C are exemplary energy band diagrams for various formations for the device shown in FIG. 1.
Figure 11B:
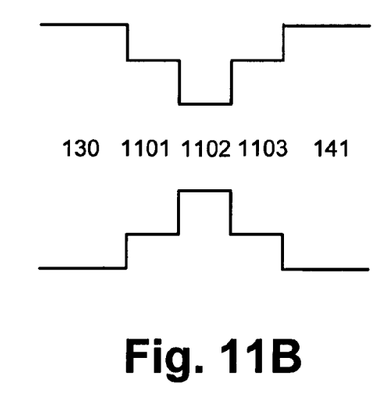
Figure 11C:
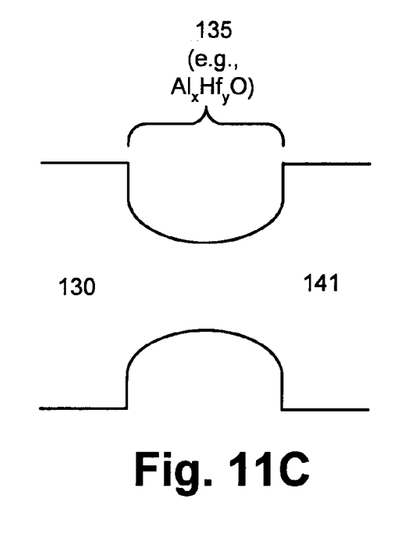

FIGS. 11A-11C are exemplary energy band diagrams for various formations of charge storing layer 135. In FIG. 11A, an energy band diagram in which charge storing layer 135 is not graded. For example, charge storing layer 135 may be a conventional nitride layer. Accordingly, charge storing layer 135 has a constant bandgap energy. FIG. 11B illustrates an energy band diagram in which charge storing layer 135 is implemented as a laminate structure of $Al_2O_3$ and $HfO_2$. Here, charge storing layer 135 may be formed as a first layer 1101 of relatively pure $Al_2O_3$, followed by a second layer 1102 of relatively pure $HfO_2$, followed by a third layer of relatively pure $Al_2O_3$. The bandgap energy within layers 1101, 1102, and 1103 are constant and there is a discontinuity at the interface between layers 1101 and 1102 and between layers 1102 and 1103. FIG. 11C illustrates an energy band diagram in which charge storing layer 135 is graded. Advantageously, the bandgap energy gradually transitions between the bandgap energy levels of pure $Al_2O_3$, pure $HfO_2$, and back to pure $Al_2O_3$. In this case, the interfaces present in the laminate structures of FIG. 11B are eliminated.

Non-High K Grading

Although the implementations above were generally described in the context of graded high-K layers, materials other than high-K materials could potentially be used to form a graded layer. For example, a graded layer may be formed of hafnium oxide and silicon.

Exemplary System

Figure 12:
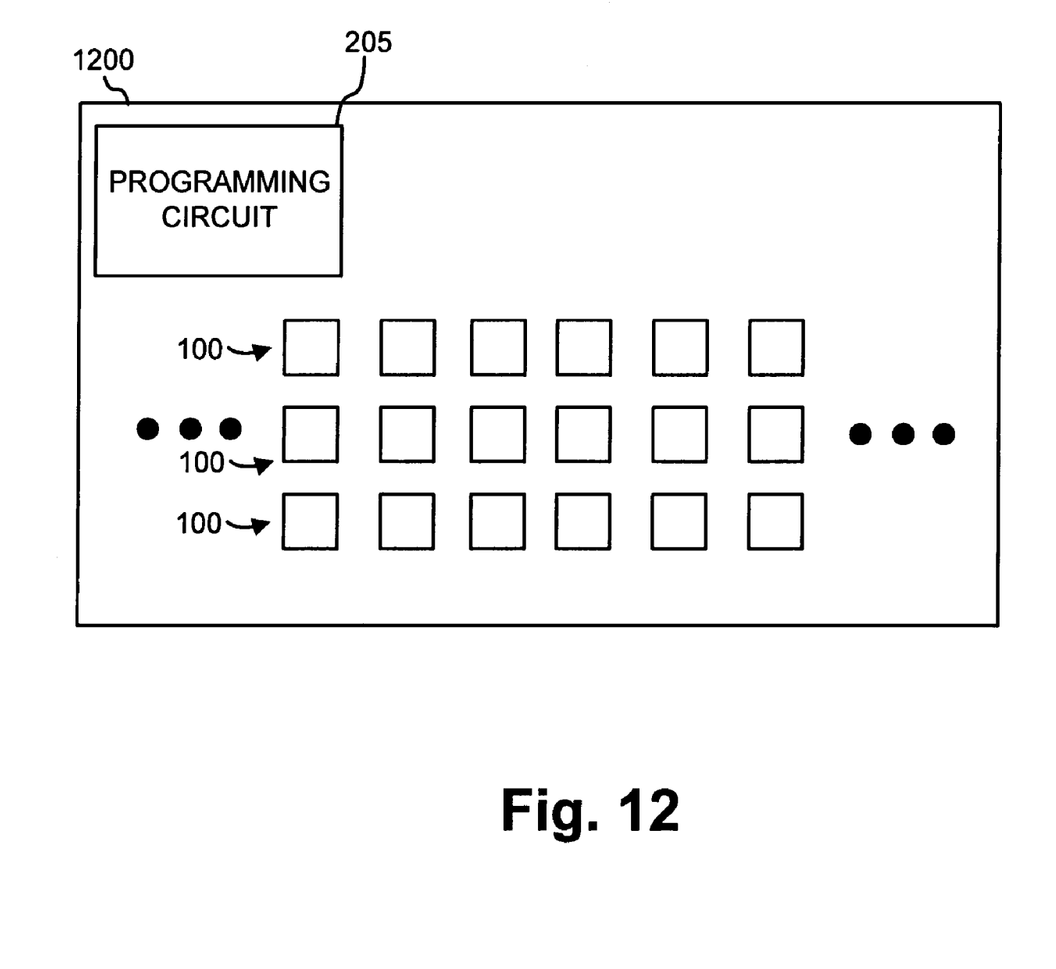
FIG. 12 is a diagram illustrating a system of semiconductor devices, such as those shown in FIG. 1, implemented on a single integrated circuit.

FIG. 12 is a diagram illustrating a system of semiconductor devices 100 implemented on a single integrated circuit 1200. Semiconductor devices 100 may each be SONOS-type memory cells. Integrated circuit 1200 may contain many thousands or millions of semiconductor devices 100 (i.e., memory cells) arranged as one or more memory arrays. Semiconductor devices 100 may be programmed/erased by programming circuit 205, as previously described.

In some embodiments, each of semiconductor devices 100 may be configured to store two bits of data. That is, charge storage layer 135 may be programmed to store two separate bits of data by localizing the first and second charges to the respective left and right sides of charge storage layer 135. For example, each of the two bits of memory cell 100 may be programmed independently to store a bit on each respective side of the charge storage layer 135. In this manner, the charges in charge storage layer 135 become effectively trapped on each respective side of charge storage layer 135. In this manner, the density of the array of memory cells may be increased.

CONCLUSION

Although particular embodiments of the invention have been described in detail, it is understood that the invention is not limited correspondingly in scope, but includes all changes, modifications and equivalents coming within the spirit and terms of the claims appended hereto.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device comprising:
   a gate dielectric formed on a substrate;
   a charge storing element formed on the gate dielectric;
   an intergate dielectric formed on the charge storing element, the intergate dielectric including at least two high-K materials deposited in a graded manner with respect to each other and an oxide layer formed at a first interface below the at least two high-K materials; and
   a control gate formed at a second interface above the intergate dielectric, wherein the intergate dielectric comprises:
   mostly one of the at least two high-K materials at the first interface, mostly another one of the at least two high-K materials at the second interface, and a progressive gradation of the one high-K material and the other one high-K material between the first and second interfaces.

2. The memory device of claim 1, wherein the one high-K material includes aluminum oxide and the other one high-K material includes hafnium oxide.

3. The memory device of claim 1, wherein the at least two high-K materials comprise at least two of silicon oxynitride, aluminum oxide, hafnium silicate, hafnium silicon oxynitride, hafnium silicon nitride, hafnium oxide, zirconium, or tantalum oxide.

4. The memory device of claim 1, wherein the high-K materials have a K value greater than that of silicon dioxide.

5. The memory device of claim 1, wherein the charge storing element includes at least two high-K materials.

6. The memory device of claim 5, wherein the at least two high-K materials in the charge storing element are deposited in a graded manner with respect to each other.

7. The memory device of claim 1, wherein the memory device is a SONOS-type memory cell.

8. A memory device comprising:
a gate dielectric formed on a substrate;
a charge storing element formed on the gate dielectric;
an intergate dielectric formed on the charge storing element, wherein the intergate dielectric is deposited such that a first end of the intergate dielectric includes mostly aluminum oxide, a second end of the intergate dielectric includes mostly hafnium oxide, and the aluminum and hafnium oxide are gradually graded between the first and second ends of the intergate dielectric; and
a control gate formed above the intergate dielectric.

9. A method of manufacturing a semiconductor device, comprising:
forming a first dielectric over a substrate;
forming a charge storage element over the first dielectric, wherein the charge storage element includes two or more high-K materials deposited in a graded manner with respect to each other, such that one of the two or more high-K materials is relatively pure at a first and a second end of the charge storage element, a second high-K material is relatively pure near the middle of the charge storing element, and the first and second high-K materials are gradually graded between the middle and the first and second ends of the charge storing element;
forming a second dielectric over the charge storage element;
forming a third dielectric over the second dielectric, the third dielectric including at least two high-K materials deposited in a graded manner with respect to each other; and
forming a control gate over the third dielectric.

10. The method of claim 9, wherein the third dielectric comprises aluminum oxide and hafnium oxide.

11. The method of claim 9, wherein the charge storage element comprises a nitride.

12. The method of claim 9, wherein the third dielectric is formed via atomic layer deposition (ALD) in which a ratio of ALD cycles between the at least two high-K materials is altered to obtain the graded deposition of the at least two high-K materials.

13. A memory device comprising:
a gate dielectric formed on a substrate;
a charge storing element formed on the gate dielectric, the charge storing element including at least two high-K materials deposited in a graded manner with respect to each other such that a first high-K material is relatively pure at a first and second end of the charge storing element, a second high-K material is relatively pure near the middle of the charge storing element, and the first and second high-K materials are gradually graded between the middle and the first and second ends of the charge storing element;
an intergate dielectric formed on the charge storing element; and
a control gate formed above the intergate dielectric.

14. The memory device of claim 13, wherein the high-K materials comprise at least one of silicon oxynitride, aluminum oxide, hafnium silicate, hafnium silicon oxynitride, hafnium silicon nitride, hafnium oxide, zirconium, or tantalum oxide.

15. A memory device comprising:
a gate dielectric formed on a substrate;
a charge storing element formed on the gate dielectric, the charge storing element including at least two high-K materials deposited in a graded manner with respect to each other between opposing ends of the charge storing element, wherein the opposing ends comprise a relatively pure form of one of the at least two high-K materials;
an intergate dielectric formed on the charge storing element, wherein the intergate dielectric includes:
a first oxide layer; and
a second layer including at least one high-K material; and
a control gate formed above the intergate dielectric.

16. The memory device of claim 15, wherein the second layer of the intergate dielectric includes a plurality of high-K materials deposited in a graded manner with respect to one another.

17. The memory device of claim 1, wherein the one high-K material has a lower dielectric constant than the other one high-K material.

* * * * *